(12) United States Patent
Yoshioka et al.

(10) Patent No.: US 10,964,631 B2
(45) Date of Patent: Mar. 30, 2021

(54) SEMICONDUCTOR PACKAGE AND MODULE

(71) Applicant: MITSUBISHI ELECTRIC CORPORATION, Tokyo (JP)

(72) Inventors: Hideharu Yoshioka, Tokyo (JP); Akimichi Hirota, Tokyo (JP); Naofumi Yoneda, Tokyo (JP); Hidenori Ishibashi, Tokyo (JP); Shintaro Shinjo, Tokyo (JP); Kiyoshi Ishida, Tokyo (JP); Hideki Morishige, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 475 days.

(21) Appl. No.: 16/067,522

(22) PCT Filed: Feb. 25, 2016

(86) PCT No.: PCT/JP2016/055658
§ 371 (c)(1),
(2) Date: Jun. 29, 2018

(87) PCT Pub. No.: WO2017/145331
PCT Pub. Date: Aug. 31, 2017

(65) Prior Publication Data
US 2020/0126896 A1    Apr. 23, 2020

(51) Int. Cl.
*H01L 23/498*   (2006.01)
*H01L 23/00*   (2006.01)
*H01L 23/31*   (2006.01)

(52) U.S. Cl.
CPC .... *H01L 23/49811* (2013.01); *H01L 23/3121* (2013.01); *H01L 23/49827* (2013.01); *H01L 23/49861* (2013.01); *H01L 24/45* (2013.01)

(58) Field of Classification Search
None
See application file for complete search history.

(56) References Cited

U.S. PATENT DOCUMENTS

| 5,087,961 A | * | 2/1992 | Long | H01L 21/50 257/701 |
| 9,894,816 B2 | | 2/2018 | Saji et al. | |

(Continued)

FOREIGN PATENT DOCUMENTS

| JP | 4-72648 U | 6/1992 |
| JP | 9-172114 A | 6/1997 |

(Continued)

OTHER PUBLICATIONS

Extended European Search Report issued in related European Application No. 16891488.5 dated Jan. 4, 2019.

*Primary Examiner* — Angel Roman
(74) *Attorney, Agent, or Firm* — Birch, Stewart, Kolasch & Birch, LLP.

(57) ABSTRACT

A semiconductor package includes a package main body. The package main body includes: a lead frame that includes first terminals and a die pad; two or more integrated circuit chips that are disposed on the die pad; one or more electrically conductive members that are disposed on the die pad; wires that connect the first terminals and the integrated circuit chips electrically; and a molded member that seals the lead frame, the integrated circuit chips, the electrically conductive member, and the wires. An upper surface, a bottom surface, and side surfaces of the package main body are formed by the molded member. The electrically conductive member is exposed through the upper surface of the package main body, and the die pad is exposed through the bottom surface of the package main body.

12 Claims, 16 Drawing Sheets

(56) References Cited

U.S. PATENT DOCUMENTS

| | | |
|---|---|---|
| 2009/0095979 A1 | 4/2009 | Saito et al. |
| 2011/0049685 A1 | 3/2011 | Park et al. |
| 2019/0189553 A1* | 6/2019 | Hohlfeld ............ H01L 23/3135 |

FOREIGN PATENT DOCUMENTS

| | | |
|---|---|---|
| JP | 10-125830 A | 5/1998 |
| JP | 2005-252099 A | 9/2005 |
| JP | 2009-105389 A | 5/2009 |
| JP | 2009-206204 A | 9/2009 |
| JP | 2012-19091 A | 1/2012 |
| JP | 2013-26296 A | 2/2013 |
| JP | 2015-211091 A | 11/2015 |
| WO | WO 2015/119151 A1 | 8/2015 |

\* cited by examiner

SEMICONDUCTOR PACKAGE AND MODULE

TECHNICAL FIELD

The present invention relates to a semiconductor package and module, in which an integrated circuit (IC) chip is sealed using a molded member.

BACKGROUND ART

Conventionally, quad-flat no-lead packages (QFNs) are widely used as semiconductor packages that enable high heat radiation and high density mounting. QFNs are surface-mount semiconductor packages that have: an integrated circuit (IC) chip; a die bonding area that is a metal sheet onto which the IC chip is mounted; terminals for external connection; wires that connect the IC chip and the terminals; and a resin molded member that seals these.

Conventionally, surface-mount semiconductor packages are known in which a plurality of IC chips are sealed together using a resin molded member in order to achieve larger systems using a single semiconductor package. Examples of such semiconductor packages include multi-chip packages (MCPs), multi-chip modules (MCMs), and systems-in-package (SiPs), for example. In semiconductor packages in which a plurality of IC chips are sealed together using a molded member, since the electrode pads, wires, and terminals of the IC chips, which each have separate functions, are disposed in close proximity, some of the input/output signals in each of the IC chips are easily coupled electrically by means of the respective electrode pads, wires, or terminals. This electrical coupling degrades isolation among the IC chips, and constitutes a cause that gives rise to malfunctioning of the IC chips.

Conventionally, semiconductor packages have been proposed in which distances between electrode pads, distances between wires, and distances between terminals of IC chips are all separated by greater than or equal to a fixed distance in order to suppress deterioration of isolation among the IC chips (see Patent Literature 1, for example).

Conventionally, semiconductor packages have also been proposed in which IC chips that are mounted to a circuit board are covered by a metal sheet that functions as electromagnetic shielding, and a resin is filled between the IC chips and the metal sheet, in order to suppress external electromagnetic interference on the IC chips (see Patent Literature 2, for example).

In addition, conventionally, modules have also been proposed in which a plurality of semiconductor packages that are each mounted to a module circuit board are sealed together using a resin molded member, and conductor shielding is disposed on an external surface of the molded member, in order to suppress external electromagnetic interference on the plurality of semiconductor packages. In these modules, conductor posts that extend from the module circuit board to the conductor shielding are disposed in the molded member (see Patent Literature 3 and 4, for example).

CITATION LIST

Patent Literature

Patent Literature 1

Japanese Patent Laid-Open No. 2005-252099 (Gazette)

Patent Literature 2

Japanese Patent Laid-Open No. 2015-211091 (Gazette)

Patent Literature 3

Japanese Patent Laid-Open No. 2012-19091 (Gazette)

Patent Literature 4

WO 2015/119151

SUMMARY OF THE INVENTION

Problem to be Solved by the Invention

In the space that is covered by the conductor shielding, cavity resonance arises depending on the size of that space. If the frequency of the cavity resonance is in a vicinity of an operating band of the IC chips, then some of the input/output signals in the IC chips will couple electrically by means of the electrode pads, the wires, or the terminals irrespective of the magnitude of distances between the electrode pads, the distances between the wires, and the distances between the terminals of the IC chips. This electrical coupling degrades isolation among the IC chips, and constitutes a cause that gives rise to malfunctioning of the IC chips. Consequently, in semiconductor packages in which electromagnetic shielding is performed by conductor shielding, if the space that is covered by the conductor shielding, i.e., the cavity, is reduced, the frequency of the cavity resonance becomes higher, removing the frequency of the cavity resonance from the operating band of the IC chips, and enabling deterioration of isolation among the IC chips to be suppressed.

However, in the conventional semiconductor package that is disclosed in Patent Literature 1, because the distances between the electrode pads, the distances between the wires, and the distances between the terminals are large, the size of the semiconductor package is increased, increasing the size of the space that is covered by the conductor shielding even if the semiconductor package is covered by a conductor shielding. Thus, the frequency of the cavity resonance is in a vicinity of the operating band of the IC chips or is less than or equal to the operating band.

In the conventional modules that are disclosed in Patent Literature 3 and 4, the size of the space that is covered by the conductor shielding is also larger than that of the semiconductor packages, making it difficult to increase the frequency of the cavity resonance.

At the same time, there is demand for increased heat-radiating characteristics in semiconductor packages in order to prevent malfunctioning that results from temperature increases due to the generation of heat by the IC chips. However, in the conventional semiconductor package that is disclosed in Patent Literature 1, because the IC chips are sealed by a molded member that has low thermal conductivity, and a heat radiating mechanism only exists on a bottom surface side of the semiconductor package, heat that is generated by the IC chips is less likely to be radiated from an upper surface of the semiconductor package, making exhaust heat performance of the semiconductor package poor.

In the conventional semiconductor package that is disclosed in Patent Literature 2, since the IC chips are mounted to a circuit board, the amount of heat that is transferred from the IC chips toward the bottom surface side of the semiconductor package is limited by the circuit board, making exhaust heat performance from the bottom surface of the semiconductor package poor. Furthermore, because a molded member that has low thermal conductivity is interposed between the metal sheet and the IC chips, heat that is generated by the IC chips is less likely to be transferred to the metal sheet, making exhaust heat performance from the upper surface of the semiconductor package poor.

In addition, in the modules that are disclosed in Patent Literature 3 and 4, since the semiconductor packages are also mounted to module circuit boards that have low thermal conductivity, heat that is generated by the IC chips inside the semiconductor packages is less likely to be radiated from the module circuit board, making exhaust heat performance from the bottom surface of the modules poor. Because a molded member that has low thermal conductivity is interposed between the conductor shielding and the semiconductor packages, heat that is generated by the IC chips inside the semiconductor packages is less likely to be transferred to the conductor shielding, making exhaust heat performance from the upper surfaces of the modules poor.

The present invention aims to solve the above problems and an object of the present invention is to provide a semiconductor package and module that can suppress deterioration of performance of electromagnetic shielding, and that can also enable improvements in exhaust heat performance.

Means for Solving the Problem

A semiconductor package and module according to the present invention includes a package main body, wherein: the package main body includes: a lead frame that includes first terminals and a die pad; two or more integrated circuit chips that are disposed on the die pad; one or more electrically conductive members that are disposed on the die pad; wires that connect the first terminals and the integrated circuit chips electrically; and a molded member that seals the lead frame, the integrated circuit chips, the electrically conductive member, and the wires; an upper surface, a bottom surface, and side surfaces of the package main body are formed by the molded member; the electrically conductive member is exposed through the upper surface of the package main body; and the die pad is exposed through the bottom surface of the package main body.

A semiconductor package and module according to the present invention includes a package main body, wherein: the package main body includes: a package circuit board on which a terminal pattern is disposed; a metal inlay that is disposed on the package circuit board; two or more integrated circuit chips that are disposed on the metal inlay; one or more electrically conductive members that are disposed on the metal inlay; wires that connect the terminal pattern and the integrated circuit chips electrically; and a molded member that seals the integrated circuit chips, the electrically conductive member, and the wires; an upper surface and side surfaces of the package main body are formed by the molded member; a bottom surface of the package main body is formed by the package circuit board; the electrically conductive member is exposed through the upper surface of the package main body; and the metal inlay is exposed through the bottom surface of the package main body.

Effects of the Invention

According to a semiconductor package and module according to the present invention, heat that is generated in integrated circuit chips can be radiated from the upper surface of the package main body by means of the electrically conductive member, and can also be radiated from the bottom surface of the package main body by means of the die pads or the metal inlay, enabling improvements in exhaust heat performance of the semiconductor package and the module to be achieved. A ground that contains the electrically conductive member can also be disposed through the semiconductor package. Effective size of space in which cavity resonance occurs can thereby be reduced, enabling the deterioration of performance in electromagnetic shielding of the semiconductor package and the module to be suppressed.

DESCRIPTION OF EMBODIMENTS

Preferred embodiments of the present invention will now be explained with reference to the drawings.

Embodiment 1

Figure 1:
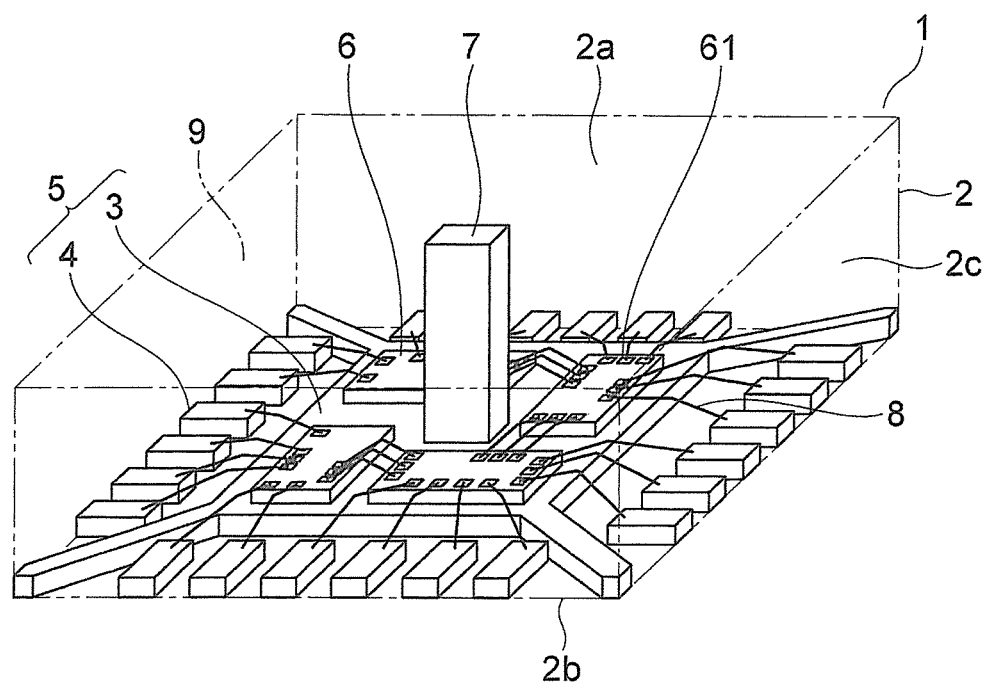
FIG. 1 is an oblique projection that shows a semiconductor package according to Embodiment 1 of the present invention.
Figure 2:
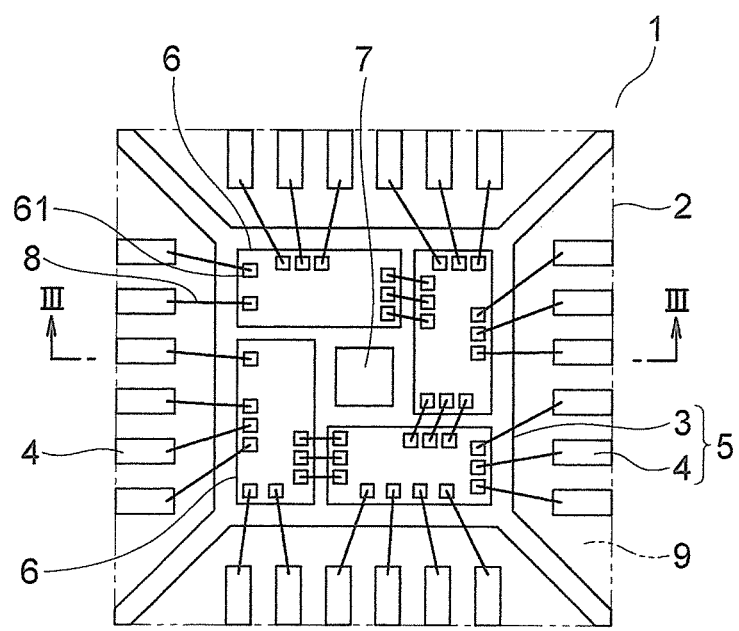
FIG. 2 is a top plan that shows the semiconductor package from FIG. 1.
Figure 3:
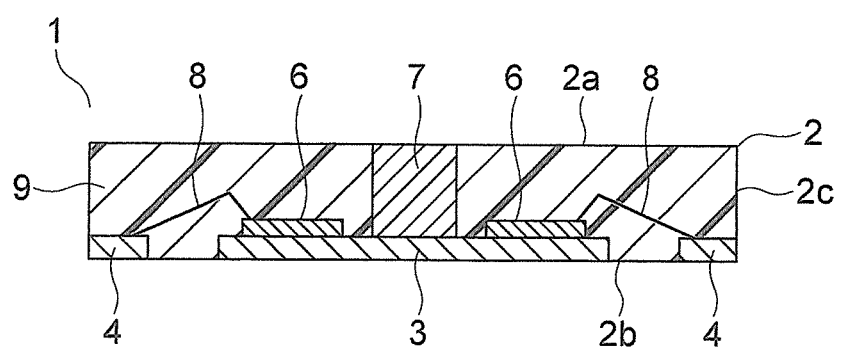
FIG. 3 is a cross section that is taken along Line III-III in FIG. 2.

FIG. 1 is an oblique projection that shows a semiconductor package according to Embodiment 1 of the present invention. FIG. 2 is a top plan that shows the semiconductor package from FIG. 1, and FIG. 3 is a cross section that is taken along Line III-III in FIG. 2. In the present embodiment, a quad-flat no-lead (QFN) semiconductor package will be explained. A semiconductor package 1 has a package main body 2. In this example, the package main body 2 constitutes the semiconductor package 1 as is. The package main body 2 has: a lead frame 5 that has a die pad 3 and a plurality of signal connection terminals 4 that constitute first terminals; two or more (in this example, four) integrated circuit (IC) chips that constitute semiconductor components that are disposed on the die pad 3; a single conductor post 7 that constitutes an electrically conductive member that is disposed on the die pad 3; a plurality of wires 8 that connect the IC chips 6 and the plurality of signal connection terminals 4 electrically; and a resin molded member 9 that seals in the lead frame 5, the IC chips 6, the conductor post 7, and each of the wires 8.

The die pad 3 and each of the signal connection terminals 4 are constituted by an electrically conductive material that has thermal conductivity. Examples of the electrically conductive material that constitutes the die pad 3 and each of the signal connection terminals 4 include metals such as copper or gold, for example. The die pad 3 and each of the signal connection terminals 4 are produced by punching a metal sheet. The die pad 3 and each of the signal connection terminals 4 are disposed on a common plane in a mutually separated state. The plurality of signal connection terminals 4 are lined up around the die pad 3.

Each of the IC chips 6 is disposed on a mounting surface of the die pad 3. In this example, each of the IC chips 6 is disposed in a peripheral region that surrounds a central region on the mounting surface of the die pad 3. A plurality of electrode pads 61 for electrical connection are disposed on each of the IC chips 6.

The conductor post 7 is constituted by an electrically conductive material that has thermal conductivity. Examples of the electrically conductive material that constitutes the conductor post 7 include metals such as copper or gold, for example. The conductor post 7 is disposed on the mounting surface of the die pad 3 on which each of the IC chips 6 are disposed. In other words, the conductor post 7 and each of the IC chips 6 are disposed on a shared mounting surface of the die pad 3. In this example, the conductor post 7 is disposed in a central region on the mounting surface of the die pad 3. A height of the conductor post 7 is higher than a height of each of the IC chips 6. In this example, the shape of the conductor post 7 is a quadrangular prism.

Each of the wires 8 are constituted by an electrically conductive material that has thermal conductivity. Examples of the electrically conductive material that constitutes each of the wires 8 include metals such as copper or gold, for example. The respective wires 8 link the signal connection terminals 4 and the electrode pads 61. The IC chips 6 are thereby electrically connected to the plurality of signal connection terminals 4 by means of the plurality of wires 8.

The molded member 9 forms an external shape of the package main body 2. An upper surface 2a, a bottom surface 2b, and side surfaces 2c of the package main body 2 are thereby formed on the molded member 9. The conductor post 7 extends from the mounting surface of the die pad 3 to the upper surface 2a of the package main body 2. An end portion of the conductor post 7 is thereby exposed outside the package main body 2 through the upper surface 2a of the package main body 2.

The die pad 3 is exposed outside the package main body 2 through the bottom surface 2b of the package main body 2. A rear surface of the die pad 3 (i.e., a surface on an opposite side of the die pad 3 from the mounting surface) is exposed through the bottom surface 2b of the package main body 2. Each of the signal connection terminals 4 is exposed outside the package main body 2 through both the bottom surface 2b and side surfaces 2c of the package main body 2.

Heat that is generated in each of the IC chips 6 is radiated from the bottom surface 2b of the package main body 2 by means of the die pad 3, and also radiated from the upper surface 2a of the package main body 2 by means of the die pad 3 and the conductor post 7.

Figure 4:
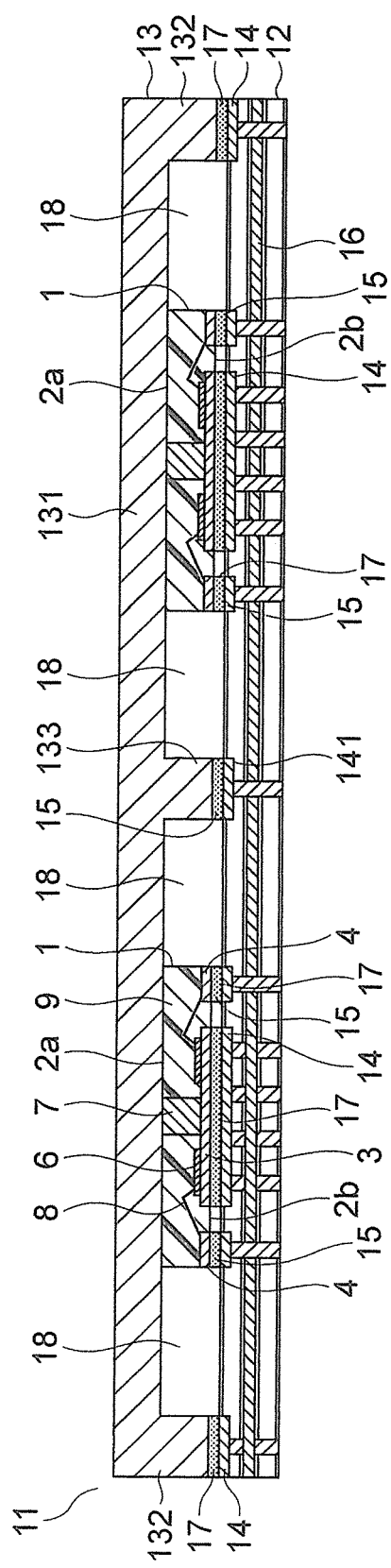
FIG. 4 is a cross section that shows a module that has the semiconductor package from FIG. 3.

FIG. 4 is a cross section that shows a module that has the semiconductor package 1 from FIG. 3. The module 11 has: a plurality of the semiconductor packages 1; a module circuit board 12 to which the plurality of semiconductor packages 1 are mounted; and an electrically conductive cover 13 that covers the plurality of semiconductor packages 1 collectively.

Disposed on a mounting surface of the module circuit board 12 to which the semiconductor packages 1 are mounted are a plurality of ground terminals 14, and a plurality of signal terminals 15. An electrically conductive pattern that is grounded is also disposed on the module circuit board 12 as a ground conductor 16. The plurality of ground terminals 14 are connected to the ground conductor 16. The plurality of signal terminals 15 are connected to signal wires (not shown) that are disposed on the module circuit board 12.

The cover 13 is constituted by an electrically conductive material that has thermal conductivity. Examples of the electrically conductive material that constitutes the cover 13 include metals such as copper, for example. The cover 13 has: a cover main body portion 131 that faces the mounting surface of the module circuit board 12; a cover peripheral wall portion 132 that protrudes toward the module circuit board 12 from an outer circumferential portion of the cover main body portion 131; and a cover partitioning portion 133 that protrudes toward the module circuit board 12 from an intermediate portion of the cover main body portion 131.

The plurality of semiconductor packages 1 are disposed in a space that is surrounded by the module circuit board 12 and the cover 13. Each of the semiconductor packages 1 is disposed separately in a space that is partitioned by the cover partitioning portion 133.

The cover peripheral wall portion 132 and the cover partitioning portion 133 are each connected to the ground terminals 14 by means of electrically conductive connecting members 17 that have thermal conductivity. A solder, for example, can be used for the electrically conductive connecting members 17. The cover peripheral wall portion 132 and the cover partitioning portion 133 are thereby each electrically connected to the ground conductor 16 by means of the respective ground terminals 14. By being connected to each other electrically, the cover 13 and the ground conductor 16 constitute an electrically conductive shielding case that accommodates the plurality of semiconductor packages 1.

Each of the semiconductor packages 1 is disposed so as to be separated from the cover peripheral wall portion 132 and the cover partitioning portion 133. Thus, spaces 18 exist between the cover peripheral wall portion 132 and the semiconductor packages 1 and between the cover partitioning portion 133 and the semiconductor packages 1. Furthermore, each of the semiconductor packages 1 is disposed in a state in which the upper surface 2a of the package main body 2 faces the cover main body portion 131, and the bottom surface 2b of the package main body 2 faces the module circuit board 12. In addition, each of the semiconductor packages 1 is mounted to the module circuit board 12 in a state in which the die pad 3 is connected to the ground terminals 14 by means of the electrically conductive connecting members 17, and each of the signal connection terminals 4 are connected to the signal terminals 15 by means of the electrically conductive connecting members 17. The die pads 3 of the semiconductor packages 1 are thereby connected thermally and electrically to the ground conductor 16. Furthermore, each of the semiconductor packages 1 is disposed in a state in which the upper surface 2a of the package main body 2 is placed in contact with the cover main body portion 131. The portion of the conductor post 7 that is exposed through the upper surface 2a of the package main body 2 thereby contacts the cover main body portion 131. The conductor posts 7 of the semiconductor packages 1 are thereby connected to the cover 13 thermally and electrically.

Column-shaped grounds that are formed by the conductor posts 7, the die pads 3, the electrically conductive connecting members 17, and the ground terminals 14 are disposed in the spaces (i.e., the cavities) inside the shielding case that are formed by the cover 13 and the ground conductor 16.

Heat that is generated in each of the IC chips 6 of the semiconductor packages 1 is radiated to the cover 13 by means of the die pad 3 and the conductor post 7, and also radiated to the ground conductor 16 by means of the die pad 3, the electrically conductive connecting members 17, and the ground terminals 14.

In a semiconductor package 1 and a module 11 of this kind, because a conductor post 7 is disposed on a die pad 3 on which two or more IC chips 6 are disposed, and the die pad 3 is exposed through a bottom surface 2b of a package main body 2, and the conductor post 7 is exposed through an upper surface 2a of the package main body 2, heat that is generated in each of the IC chips 6 can be radiated not only from the upper surface 2a of the package main body 2 by means of the die pad 3 and the conductor post 7, but also radiated from the bottom surface 2b of the package main body 2 by means of the die pad 3. Improvements in exhaust heat performance of the semiconductor package 1 can thereby be achieved. Furthermore, if a module 11 is configured by covering the semiconductor packages 1 that are mounted to a module circuit board 12 using a cover 13, then grounds that contain the conductor posts 7 and the die pads 3 can be disposed so as to pass through the semiconductor packages 1 in spaces in a shielding case that are formed by the ground conductor 16 and the cover 13 that are disposed on the module circuit board 12. Effective spatial (i.e., cavity) size in which cavity resonance occurs can thereby be reduced, shifting the frequency of the cavity resonance to a higher range, thereby enabling the frequency of the cavity resonance to be distanced from the operating band of the IC chips 6 of the semiconductor packages 1. Consequently, high frequency performance of the electromagnetic shielding in the module 11 can be improved, enabling deterioration of the performance of the electromagnetic shielding of the semiconductor packages 1 and the module 11 to be suppressed.

Now, in order to confirm the electromagnetic shielding performance effects in the module 11 that has the semiconductor packages 1 according to Embodiment 1, cavity resonance frequencies were found by simulation for the module 11 that has the semiconductor packages 1 according to Embodiment 1, and for a module according to Comparative Example 1, respectively.

Figure 5:
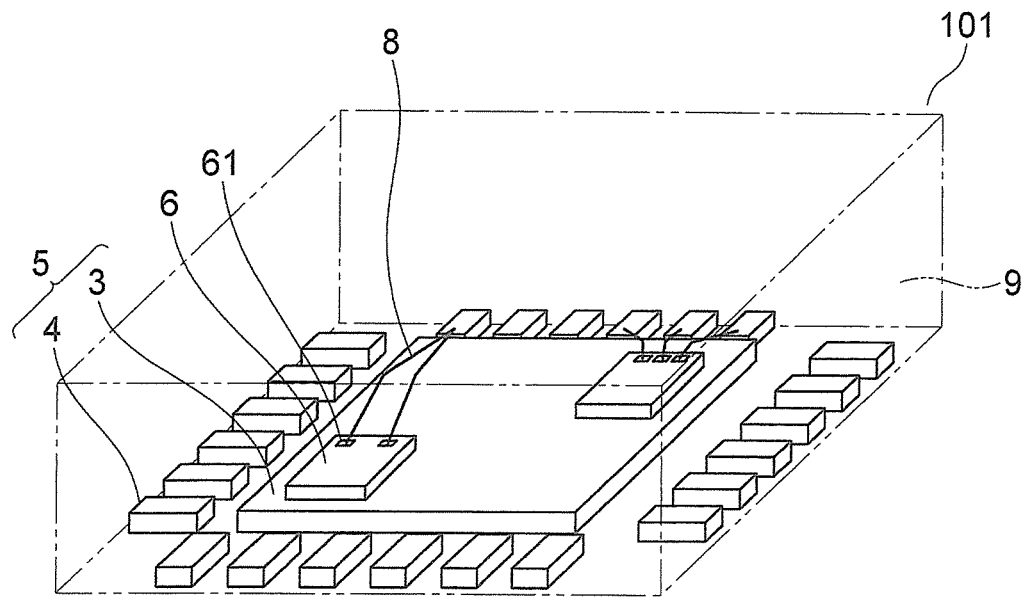
FIG. 5 is an oblique projection that shows a semiconductor package of a module according to Comparative Example 1.
Figure 6:
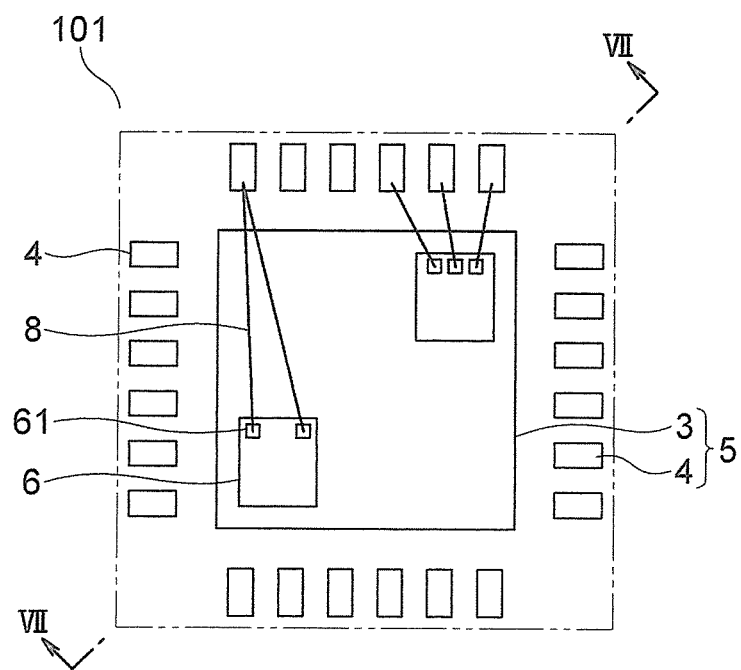
FIG. 6 is a top plan that shows the semiconductor package from FIG. 5.
Figure 7:
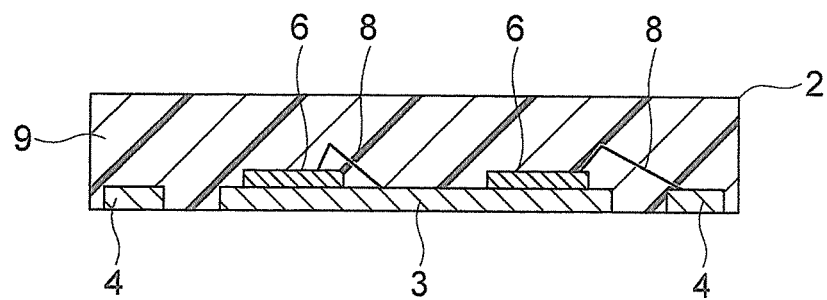
FIG. 7 is a cross section that is taken along Line VII-VII in FIG. 6.

FIG. 5 is an oblique projection that shows a semiconductor package of a module according to Comparative Example 1. FIG. 6 is a top plan that shows the semiconductor package from FIG. 5, and FIG. 7 is a cross section that is taken along Line VII-VII in FIG. 6. In die pads 3 of semiconductor packages 101 according to Comparative Example 1, two or more IC chips 6 are disposed, but conductor posts 7 are not disposed. The number of IC chips 6 that are disposed on the die pads 3 in Comparative Example 1, and the shape of the die pads 3, are also different than those in Embodiment 1. A remainder of the configuration of the semiconductor package 101 according to Comparative Example 1 is similar or identical to that of Embodiment 1.

Figure 8:
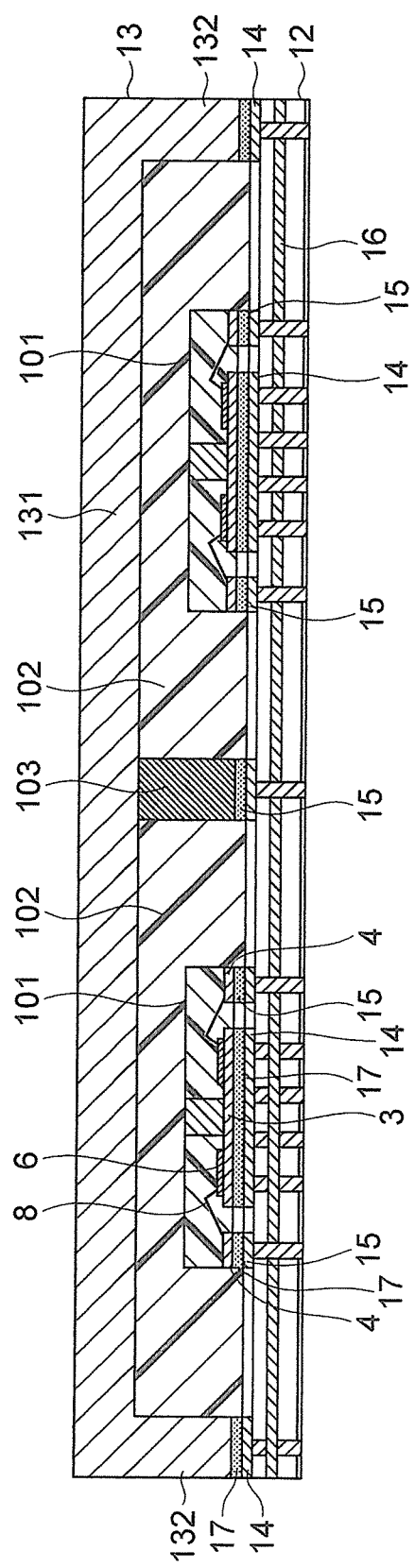
FIG. 8 is a cross section that shows a module according to Comparative Example 1 that has the semiconductor package from FIG. 7.

FIG. 8 is a cross section that shows a module according to Comparative Example 1 that has the semiconductor package 101 from FIG. 7. In the module according to Comparative Example 1, a plurality of the semiconductor packages 101 according to Comparative Example 1 are mounted to a module circuit board 12 that has a similar or identical configuration to that of Embodiment 1, and the plurality of semiconductor packages 101 are covered using a cover 13 that has a similar or identical configuration to that of Embodiment 1. An upper surface of each of the semiconductor packages 101 is separated from a cover main body portion 131 of the cover 13. A resin molded member 102 is also filled between each of the semiconductor packages 101 and the cover 13 in the module according to Comparative Example 1. A remainder of the configuration of the module according to Comparative Example 1 is similar or identical to that of Embodiment 1.

Figure 9:
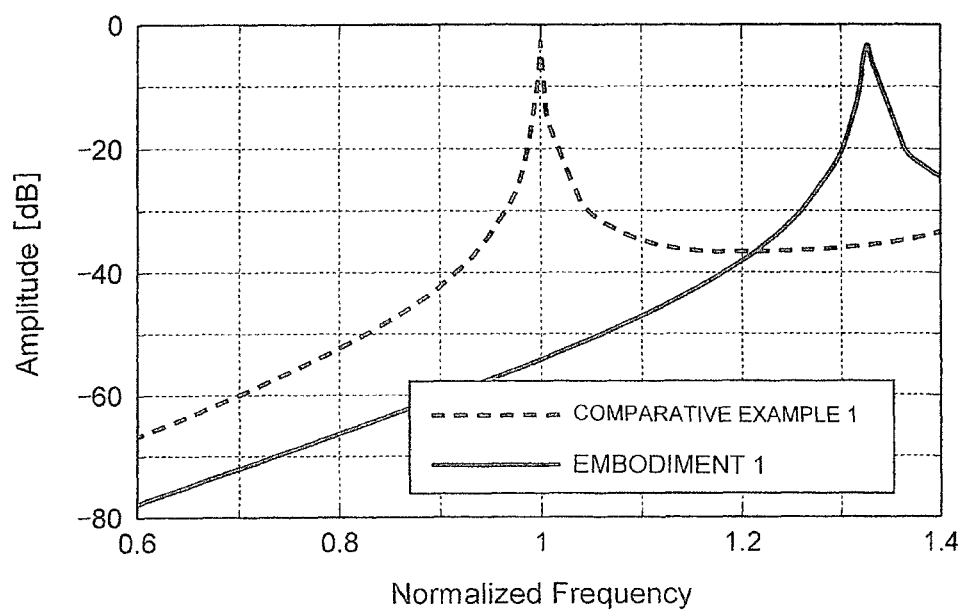
FIG. 9 is a graph that compares frequency of cavity resonance in the module according to Embodiment 1 and frequency of cavity resonance in the module according to Comparative Example 1.

FIG. 9 is a graph that compares frequency of cavity resonance in the module 11 according to Embodiment 1 and frequency of cavity resonance in the module according to Comparative Example 1. Moreover, in FIG. 9, cavity resonance frequency characteristics (isolation characteristics) between two signal connection terminals 4 that are connected to mutually different IC chips 6 are shown for modules according to Embodiment 1 and Comparative Example 1, respectively. Furthermore, in FIG. 9, normalized frequency is shown on a horizontal axis, normalized frequency being a ratio when the cavity resonance frequency in Comparative Example 1 is set to one.

As shown in FIG. 9, for example, focusing on the isolation characteristics when the normalized frequency is one, it can be seen that the cavity resonance frequencies in the module 11 according to Embodiment 1 is shifted to a higher range, greater than or equal to 1.3 times the cavity resonance frequencies in the module according to Comparative Example 1. It can thereby be confirmed that the electromagnetic shielding performance effects in the module 11 that has semiconductor packages 1 according to Embodiment 1 are improved.

Furthermore, looking at FIG. 8, it can be seen that because conductor posts do not exist in the semiconductor packages 101 according to Comparative Example 1, the heat conduction pathways from each of the IC chips 6 to the cover 13 in the module according to Comparative Example 1 are the molded member 9 and the molded member 102, which have lower thermal conductivity than metal, making it difficult for heat that is generated by each of the IC chips 6 to be radiated to the cover 13.

Figure 10:
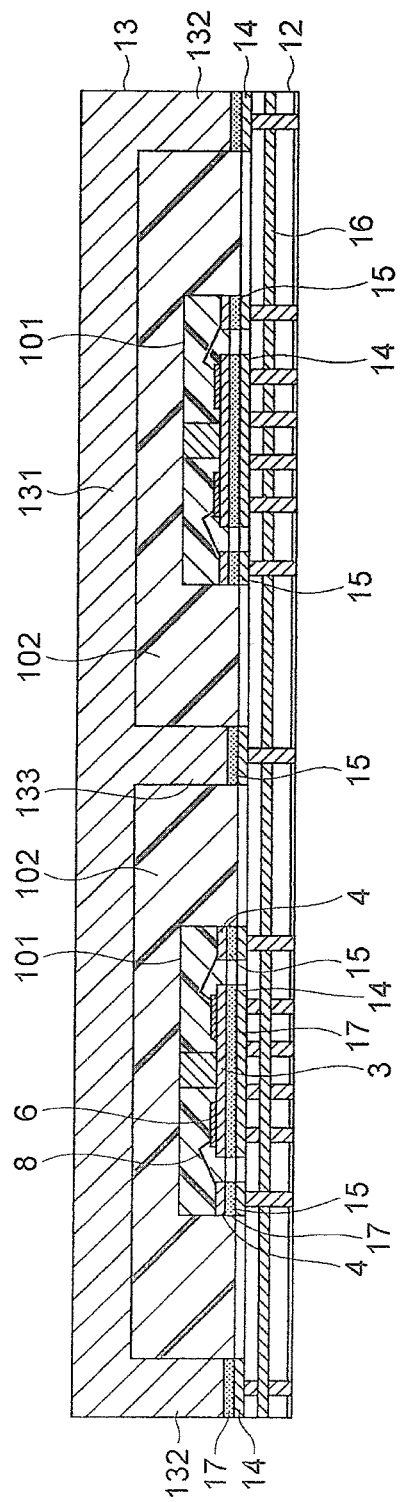
FIG. 10 is a cross section that shows a module according to Comparative Example 2.

FIG. 10 is a cross section that shows a module according to Comparative Example 2. In the module according to Comparative Example 2, a cover partitioning portion 103 of a cover 13 is a separate member from a cover main body portion 131. The cover partitioning portion 103 is constituted by an electrically conductive material that has thermal conductivity. In Comparative Example 2, the cover partitioning portion 103 is constituted by a metal that is different than that of the cover main body portion 131. A remainder of the configuration is similar or identical to that of Comparative Example 1.

Because the module according to Comparative Example 2 is similar or identical to Comparative Example 1 except that the cover main body portion 131 and the cover partitioning portion 103 are separate members, isolation characteristics and exhaust heat performance also give similar or identical results to those of Comparative Example 1.

In the module 11 according to Embodiment 1, heat that is generated by each of the IC chips 6 is not only transferred sequentially through the die pads 3 and the ground terminals 14 and discharged to the ground conductor 16 of the module circuit board 12, but is also transferred sequentially through the die pads 3 and the conductor posts 7 and discharged to the cover 13. Thus, the exhaust heat performance in the module 11 according to Embodiment 1 is higher than the exhaust heat performance in the modules according to Comparative Examples 1 and 2.

Moreover, in the above example, the electrically conductive connecting members 17 that connect the die pads 3 and the ground terminals 14 and the electrically conductive connecting members 17 that connect the signal connection terminals 4 and the signal terminals 15 are each made of metallic solder, but are not limited thereto, and members in which a metal filler is mixed together with a resin, for example, may alternatively be used for the electrically conductive connecting members 17. In this manner, thermal conductivity and electrical conductivity between the die pads 3 and the ground terminals 14 can also be ensured, enabling suppression of deterioration in isolation and improvements in exhaust heat performance to be achieved in the semiconductor packages 1 and the module 11.

Figure 11:
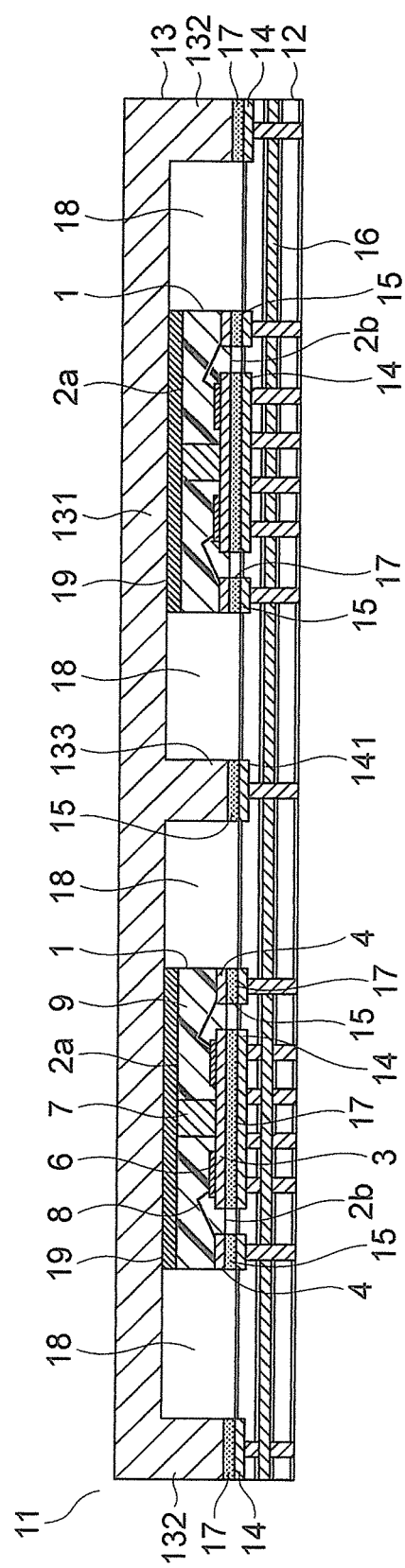
FIG. 11 is a cross section that shows another example of a module that has the semiconductor package according to Embodiment 1 of the present invention.

In the above example, the cover main body portion 131 of the cover 13 contacts the upper surfaces 2a of the package main bodies 2 of the semiconductor packages 1, but an electrically conductive filler 19 may be interposed between the upper surfaces 2a of the package main bodies 2 and the cover main body portion 131. For instance, FIG. 11 is a cross section that shows another example of a module 11 that has the semiconductor package 1 according to Embodiment 1 of the present invention. The electrically conductive filler 19 is interposed between the cover main body portion 131 each of the upper surfaces 2a of the package main bodies 2 and the conductor posts 7. The electrically conductive filler 19 is a sheet that has higher thermal conductivity than the molded member 9. In FIG. 11, the electrically conductive filler 19 is an electrically conductive sheet that has high flexibility, in which a metal filler is mixed together with a resin. The electrically conductive filler 19 is interposed between the upper surfaces 2a of the package main bodies 2 and the cover main body portion 131 in a closely fitted state with the conductor posts 7 and the cover main body portion 131 so as to conform to the shapes of the portions of the conductor posts 7 that are exposed through the upper surfaces 2a of the package main bodies 2, and to the shape of the cover main body portion 131. By interposing the electrically conductive filler 19 between the conductor posts 7 and the cover 13 in this manner, the conductor posts 7 and the cover 13 are connected thermally and electrically by means of the electrically conductive filler 19, enabling thermal conductivity and electrical conductivity between the conductor posts 7 and the cover 13 to be increased. Consequently, further improvements in the exhaust heat performance and the isolation characteristics of the module 11 can be achieved. Furthermore, even if the conductor posts 7 and the cover 13 are in a state that makes contact difficult due to manufacturing errors in at least one of either the semiconductor packages 1 or the cover 13, thermal conductivity and electrical conductivity between the conductor posts 7 and the cover 13 can be increased by interposing the electrically conductive filler 19 between the conductor posts 7 and the cover 13. Thus, the semiconductor packages 1 and the module 11 can be manufactured easily. Moreover, the electrically conductive filler 19 may be a metal sheet provided that it is deformable between the conductor posts 7 and the cover main body portion 131.

Embodiment 2

Figure 12:
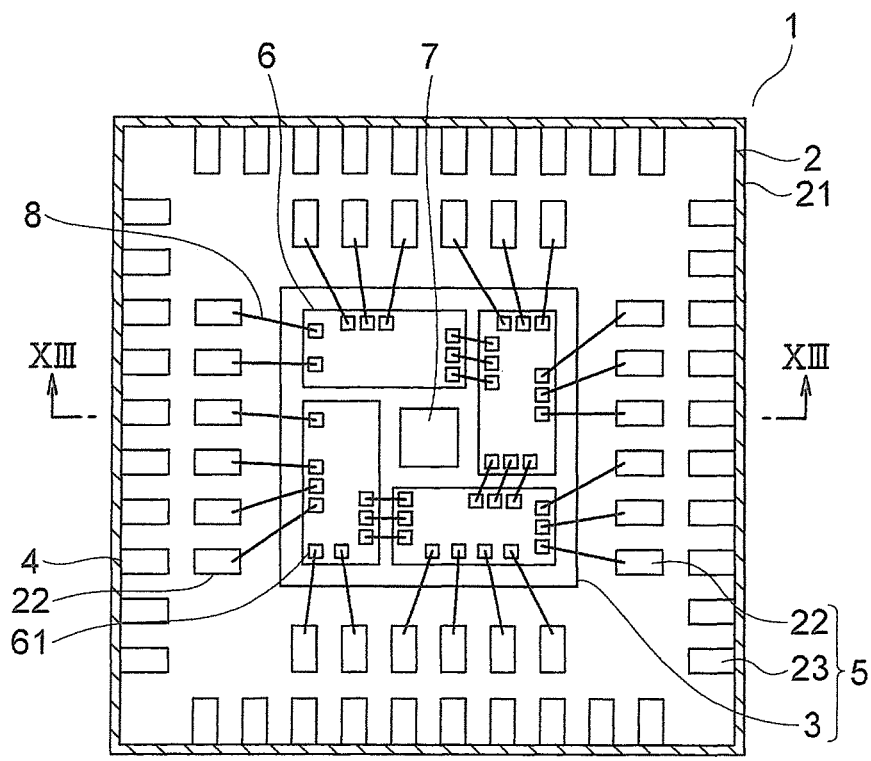
FIG. 12 is a top plan that shows a semiconductor package according to Embodiment 2 of the present invention.
Figure 13:
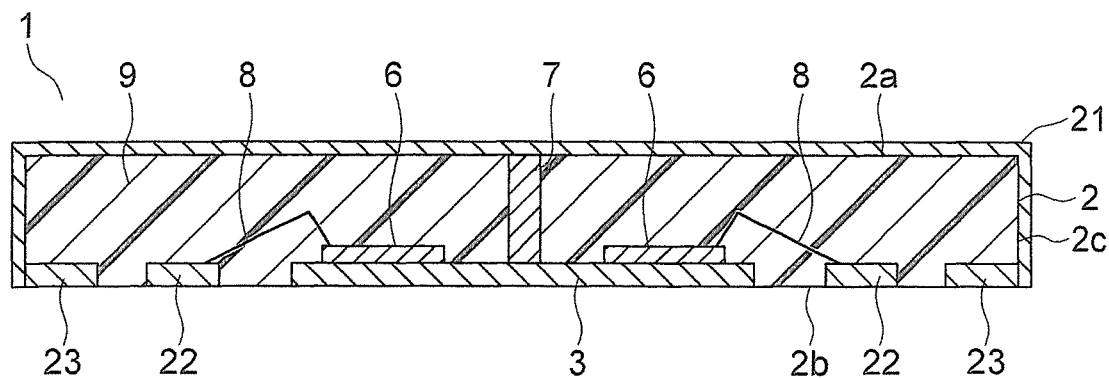
FIG. 13 is a cross section that is taken along Line XIII-XIII in FIG. 12.

FIG. 12 is a top plan that shows a semiconductor package according to Embodiment 2 of the present invention. FIG. 13 is a cross section that is taken along Line XIII-XIII in FIG. 12. A lead frame 5 that is sealed by a molded member 9 has: a die pad 3; a plurality of signal connection terminals 22 that constitute first terminals; and a plurality of ground connection terminals 23 that constitute second terminals that are different than each of the signal connection terminals 22. The die pad 3, each of the signal connection terminals 22, and each of the ground connection terminals 23 are disposed on a common plane in a mutually separated state. The plurality of signal connection terminals 22 are lined up around the die pad 3. The plurality of ground connection terminals 23 are lined up around the region in which the die pad 3 and each of the signal connection terminals 22 are disposed.

A rear surface of the die pad 3 and each of the signal connection terminals 22 are exposed through a bottom surface 2b of a package main body 2. Each of the ground connection terminals 23 is exposed through both the bottom surface 2b and side surfaces 2c of the package main body 2.

Respective wires 8 link electrode pads 61 of IC chips 6 and each of the signal connection terminals 22. The IC chips 6 are thereby electrically connected to the plurality of signal connection terminals 22 by means of the plurality of wires 8. Each of the ground connection terminals 23 is electrically insulated from each of the IC chips 6 without being electrically connected to any of the IC chips 6.

In addition to the package main body 2, a semiconductor package 1 further has an electrically conductive thin film 21 that covers the package main body 2. The electrically conductive thin film 21 covers the upper surface 2a and the side surfaces 2c of the package main body 2, excluding the bottom surface 2b of the package main body 2. The electrically conductive thin film 21 is thereby electrically connected to the conductor post 7 by the upper surface 2a of the package main body 2, and is electrically connected to each of the ground connection terminals 23 by the side surfaces 2c of the package main body 2. The electrically conductive thin film 21 is constituted by an electrically conductive material that has thermal conductivity. Examples of the electrically conductive material that constitutes the electrically conductive thin film 21 include metals such as copper, for example. The conductor posts 7 and each of the ground connection terminals 23 are thereby connected to each other thermally and electrically by means of the electrically conductive thin film 21. A remainder of the configuration of the semiconductor package 1 is similar or identical to that of Embodiment 1.

Semiconductor packages 1 that are used in a module are mounted onto a module circuit board 12 that is similar or identical to that of Embodiment 1, which is shown in FIG. 4. In the module, the die pads 3 and each of the ground connection terminals 23 of the semiconductor packages 1 are connected to ground terminals 14 of the module circuit board 12 by means of electrically conductive connecting members 17. The die pads 3 and each of the ground connection terminals 23 of the semiconductor packages 1 are thereby connected thermally and electrically to a ground conductor 16 that is disposed on the module circuit board 12. In the module, each of the signal connection terminals 22 of the semiconductor packages 1 are connected to signal terminals 15 of the module circuit board 12 by means of electrically conductive connecting members 17. In the module, the electrically conductive thin films 21 of the semiconductor packages 1 contact a cover main body portion 131 of a cover 13. The conductor posts 7 are thereby connected thermally and electrically to the cover 13 by means of the electrically conductive thin films 21. A remainder of the configuration of the module is similar or identical to that of Embodiment 1.

In semiconductor packages 1 and a module of this kind, because the package main bodies 2 are covered by an electrically conductive thin film 21, and the electrically conductive thin film 21 is electrically connected to both the conductor posts 7 and each of the ground connection terminals 23, an electromagnetic shielding function can be imparted to the semiconductor packages 1 themselves by the electrically conductive thin film 21. Deterioration in performance of the electromagnetic shielding of the semiconductor packages 1 and the module can thereby be further suppressed. Heat from the conductor posts 7 can also be transferred to each of the ground connection terminals 23 and the cover 13 easily by means of the electrically conductive thin film 21, further enabling improvements in exhaust heat performance of the semiconductor packages 1.

Moreover, in the module in the above example, an electrically conductive filler 19 may be interposed between the electrically conductive thin film 21 and the cover main body portion 131. By doing so, the conductor posts 7 and the cover 13 can be connected electrically by means of the electrically conductive filler 19, enabling thermal conductivity and electrical conductivity between the conductor posts 7 and the cover 13 to be further increased.

Embodiment 3

In Embodiments 1 and 2, lead frames are used in the semiconductor packages 1, but package circuit boards may be used in the semiconductor packages instead of lead frames.

Figure 14:
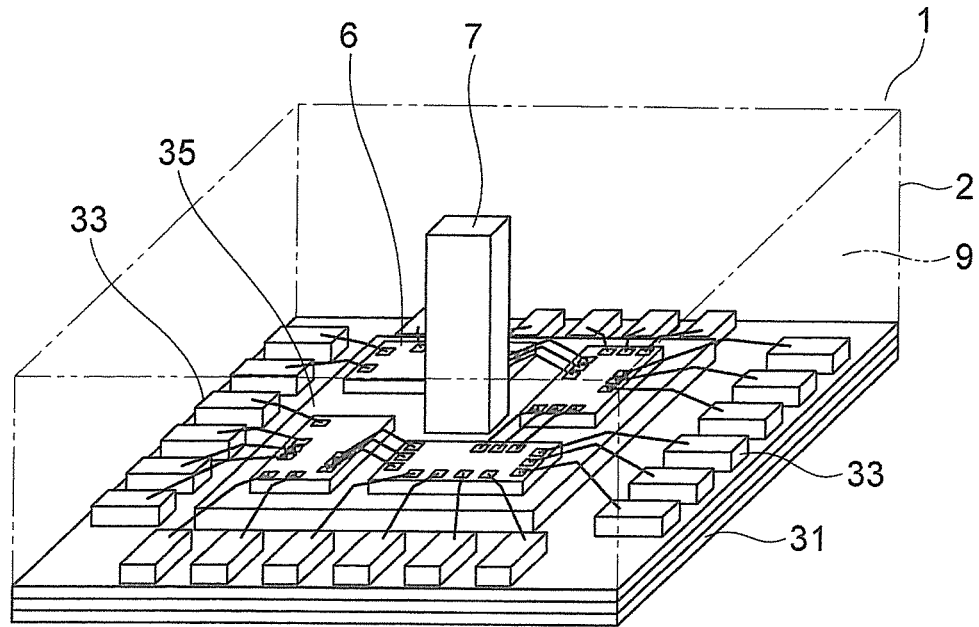
FIG. 14 is an oblique projection that shows a semiconductor package according to Embodiment 3 of the present invention.
Figure 15:
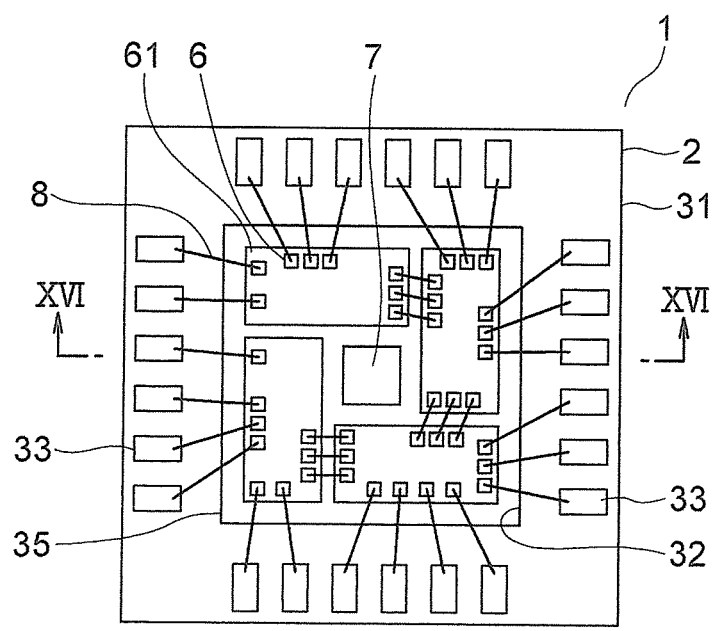
FIG. 15 is a top plan that shows the semiconductor package from FIG. 14.
Figure 16:
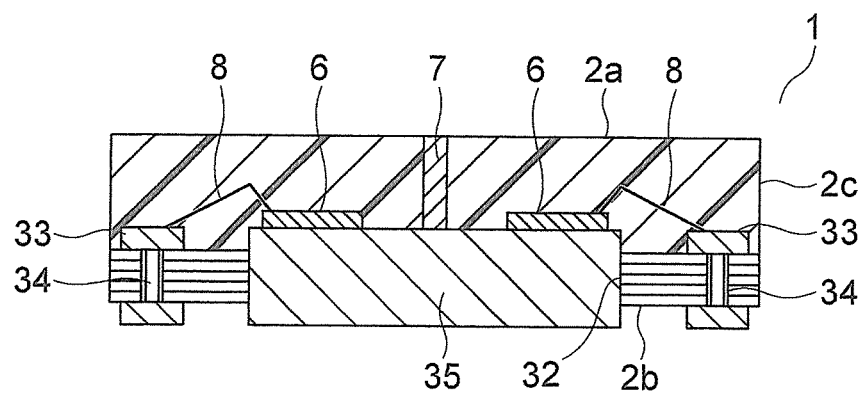
FIG. 16 is a cross section that is taken along Line XVI-XVI in FIG. 15.

For instance, FIG. 14 is an oblique projection that shows a semiconductor package 1 according to Embodiment 3 of the present invention. FIG. 15 is a top plan that shows the semiconductor package 1 from FIG. 14, and FIG. 16 is a cross section that is taken along Line XVI-XVI in FIG. 15. A semiconductor package 1 has a package main body 2. The package main body 2 has: a package circuit board 31 on which a terminal pattern 33 is disposed; a metal inlay 35 that is disposed on the package circuit board 31; two or more (in this example, four) IC chips 6 that are disposed on the metal inlay 35; a single conductor post 7 that is disposed on the metal inlay 35; a plurality of wires 8 that connect the terminal pattern 33 and the IC chips 6 electrically; and a resin molded member 9 that seals each of the IC chips 6, the conductor post 7, and each of the wires 8.

Configurations of the IC chips 6, the conductor post 7, the wires 8, and the molded member 9 are similar or identical to those of Embodiment 1. An upper surface 2a and side surfaces 2c of the package main body 2 are formed by the molded member 9. The conductor post 7 is exposed through the upper surface 2a of the package main body 2.

Formed on the package circuit board 31 are: a first surface on which the terminal pattern 33 is disposed; and a second surface that is a surface on an opposite side from the first surface, the second surface forming a bottom surface 2b of the package main body 2. An opening portion 32 that passes through in a thickness direction from the first surface to the second surface is disposed on the package circuit board 31. The metal inlay 35 is disposed on the package circuit board 31 so as to be inserted into the opening portion 32b. The metal inlay 35 is thereby exposed through the bottom surface 2b of the package main body 2.

A plurality of vias 34 that pass through the package circuit board 31 in a thickness direction are disposed on the package circuit board 31. The terminal pattern 33 that is disposed on the first surface of the package circuit board 31 is electrically connected to the electrically conductive pattern (the wiring pattern) that is disposed on the second surface or an internal portion of the package circuit board 31 by means of the vias 34. In the semiconductor package 1, it is thereby possible to lead the signals from the IC chips 6 out from a first surface side of the package circuit board 31 to a second surface side.

The metal inlay 35 is constituted by an electrically conductive material that has thermal conductivity. Examples of the electrically conductive material that constitutes the metal inlay 35 include metals such as copper, for example. A thickness of the metal inlay 35 is thicker than a thickness of the package circuit board 31. Each of the IC chips 6 and the conductor post 7 are disposed on the shared metal inlay 35. Heat that is generated by each of the IC chips 6 is thereby transferred to the conductor post 7 by means of the metal inlay 35.

Semiconductor packages 1 that are used in a module are mounted onto a module circuit board 12 that is similar or identical to that of Embodiment 1, which is shown in FIG. 4. In the present embodiment, the electrically conductive patterns that are disposed on the second surfaces of the package circuit boards 31 are connected to signal terminals 15 (FIG. 4) of the module circuit board 12 by means of electrically conductive connecting members 17. In the present embodiment, the metal inlays 35 that are exposed through the bottom surfaces 2b of the package main bodies 2 are connected to ground terminals 14 (FIG. 4) of the module circuit board 12 by means of electrically conductive connecting members 17. A remainder of the configurations of the semiconductor package 1 and the module are similar or identical to those of Embodiment 1.

Figure 17:
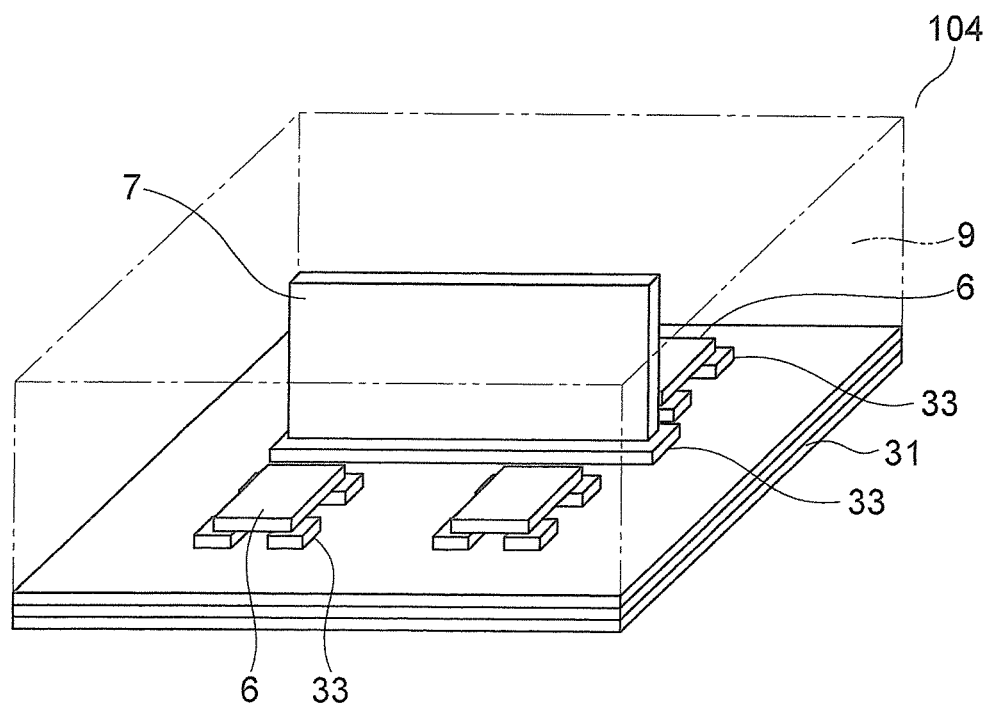
FIG. 17 is an oblique projection that shows a semiconductor package according to Comparative Example 3.
Figure 18:
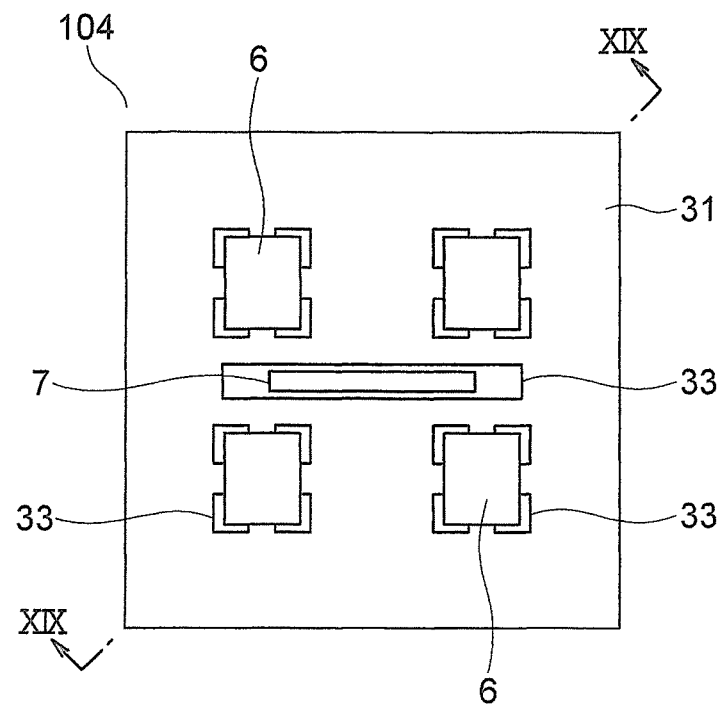
FIG. 18 is a top plan that shows the semiconductor package from FIG. 17.
Figure 19:
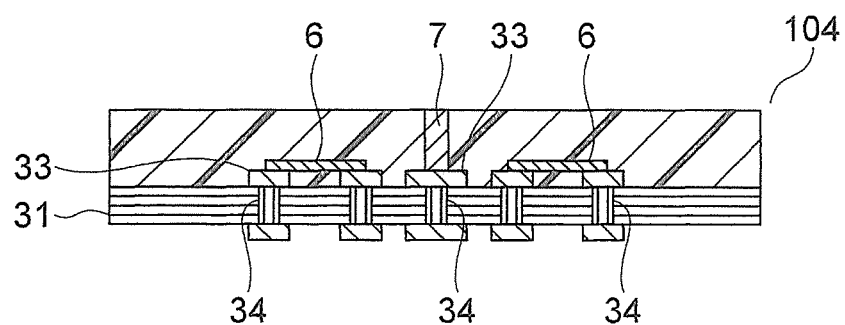
FIG. 19 is a cross section that is taken along Line XIX-XIX in FIG. 18.

Comparative Example 3 for comparison with Embodiment 3 will now be explained. FIG. 17 is an oblique projection that shows a semiconductor package 104 according to Comparative Example 3. FIG. 18 is a top plan that shows the semiconductor package 104 from FIG. 17, and FIG. 19 is a cross section that is taken along Line XIX-XIX in FIG. 18. In the semiconductor packages according to Comparative Example 3, a plurality of terminal patterns 33 are disposed on a first surface of the package circuit board 31 so as to be separated from each other. Each of the terminal patterns 33 is electrically connected to an electrically conductive pattern on a second surface on an opposite side from the first surface by means of vias 34 that pass through the package circuit board 31 in a thickness direction.

Among the plurality of terminal patterns 33 that are disposed on the first surface of the package circuit board 31, a tabular conductor post 7 is disposed on a terminal pattern 33 that is positioned centrally on the package circuit board 31, and a plurality of IC chips 6 are respectively disposed on a plurality of terminal patterns 33 that are positioned around the central terminal pattern 33. Each of the IC chips 6 and the conductor post 7 are each electrically connected by means of mutually different vias 34 to mutually different electrically conductive patterns that are disposed on the second surface of the package circuit board 31. A remainder of the configuration of the semiconductor package 104 according to Comparative Example 3 is similar or identical to that of Embodiment 3.

When semiconductor packages 104 according to Comparative Example 3 are used in a module, the semiconductor packages 104 are mounted to the module circuit board that is shown in FIG. 4, on which signal terminals 15 and ground terminals 14 are disposed. In Comparative Example 3, the electrically conductive patterns of the semiconductor packages 104 that are connected to each of the IC chips 6 by means of the vias 34 are connected to the signal terminals 15 by means of electrically conductive connecting members, and the electrically conductive patterns of the semiconductor packages 104 that are connected to the conductor posts 7 by means of the vias 34 are connected to the ground terminals 14 by means of electrically conductive connecting members. A remainder of the configuration of the module according to Comparative Example 3 is similar or identical to that of Embodiment 3.

In the semiconductor package 104 according to Comparative Example 3, since each of the IC chips 6 and the conductor post 7 are separately connected to a plurality of vias 34 that are mutually independent, it can be seen that heat that is generated by each of the IC chips 6 is less likely to be transferred to the conductor post 7, and will be transferred through the vias 34, which have a smaller capacity for thermal conduction, reducing exhaust heat performance.

In contrast to that, in the semiconductor package 1 according to Embodiment 3, because the metal inlay 35 is disposed on the package circuit board 31, and each of the IC chips 6 and the conductor post 7 is disposed on the shared metal inlay 35, heat that is generated in each of the IC chips 6 is not only radiated from the upper surface 2a of the package main body 2 by means of the metal inlay 35 and the conductor post 7, but can also be radiated from the bottom surface 2b of the package main body 2 by means of the metal inlay 35. Improvements in exhaust heat performance of the semiconductor package 1 can thereby be achieved. Furthermore, if a module is configured by covering the semiconductor packages 1 that are mounted to a module circuit board 12 using a cover 13, then grounds that contain the conductor posts 7 and the metal inlay 35 can be disposed so as to pass through the semiconductor packages 1 in spaces in a shielding case that are formed by the ground conductor 16 and the cover 13 that are disposed on the module circuit board 12. Effective spatial size in which cavity resonance occurs can thereby be reduced, enabling deterioration of the performance of the electromagnetic shielding of the semiconductor packages 1 and the module 11 to be suppressed. In addition, because the package circuit board 31 is used in the semiconductor package 1, the degree of design freedom of the semiconductor package 1 can be improved.

Moreover, in the module in the above example, an electrically conductive filler 19 may be interposed between the upper surface 2a of the package main body 2 and the cover main body portion 131. By doing so, the conductor posts 7 and the cover 13 can be connected electrically by means of the electrically conductive filler 19, enabling thermal conductivity and electrical conductivity between the conductor posts 7 and the cover 13 to be further increased.

Embodiment 4

Figure 20:
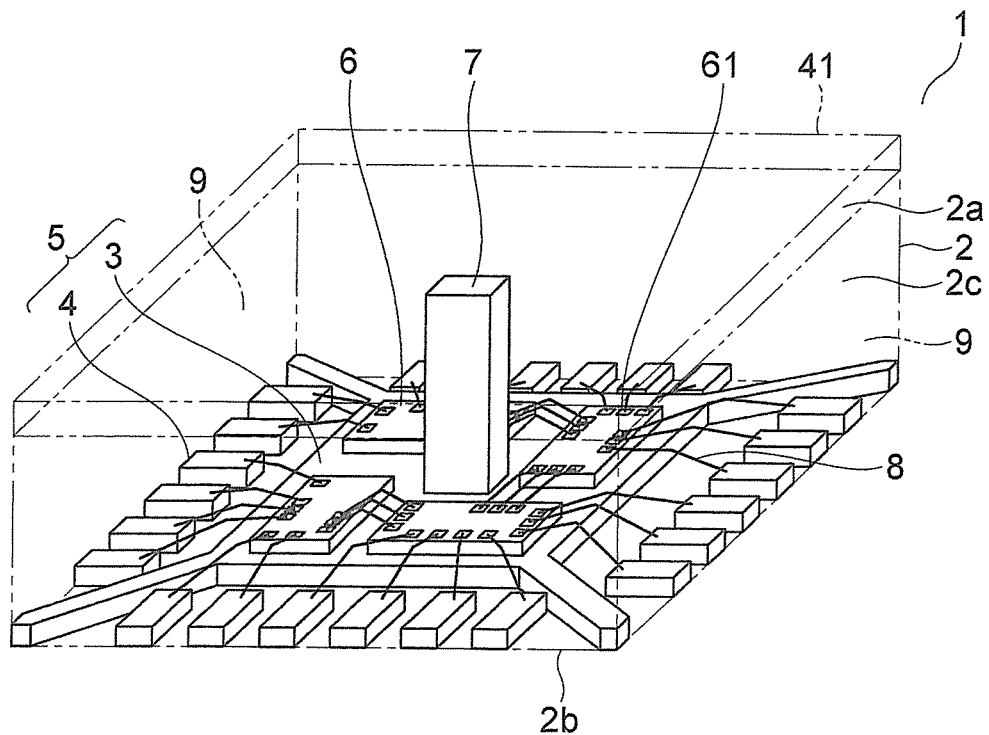
FIG. 20 is an oblique projection that shows a semiconductor package according to Embodiment 4 of the present invention.
Figure 21:
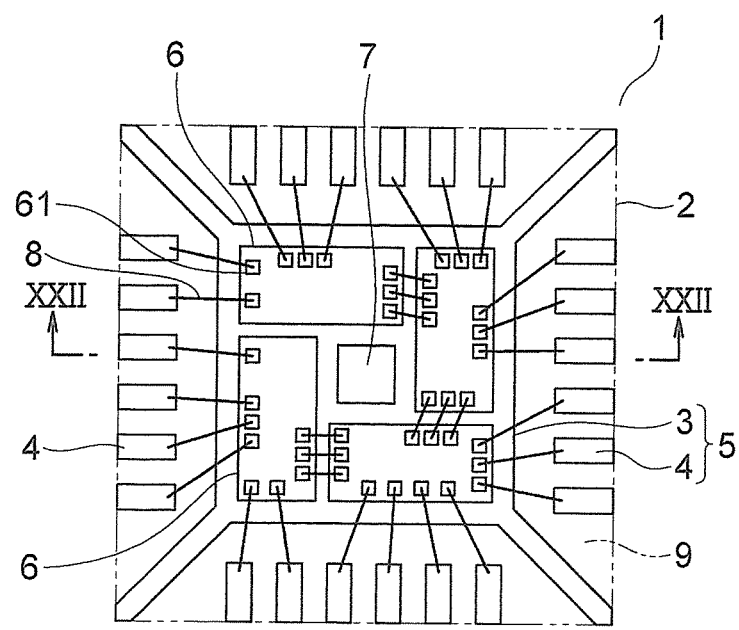
FIG. 21 is a top plan that shows the semiconductor package from FIG. 20.
Figure 22:
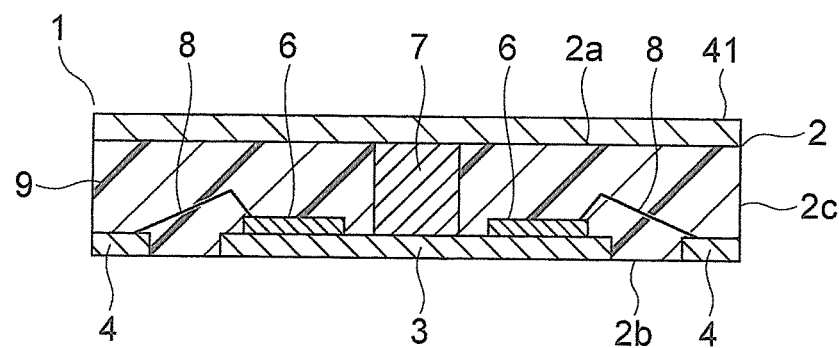
FIG. 22 is a cross section that is taken along Line XXII-XXII in FIG. 21.

FIG. 20 is an oblique projection that shows a semiconductor package according to Embodiment 4 of the present invention. FIG. 21 is a top plan that shows the semiconductor package from FIG. 20, and FIG. 22 is a cross section that is taken along Line XXII-XXII in FIG. 21. A semiconductor package 1 has: a package main body 2 that is similar or identical to that of Embodiment 1; and an electrically conductive plate 41 that is stacked on an upper surface 2a of the package main body 2.

The electrically conductive plate 41 is integrated with the molded member 9. The electrically conductive plate 41 is constituted by an electrically conductive material that has thermal conductivity. Examples of the electrically conductive material that constitutes the electrically conductive plate 41 include metals such as copper, for example. In this example, a shape of the electrically conductive plate 41 is rectangular so as to conform with a shape of the package main body 2. The electrically conductive plate 41 is in contact with a portion of a conductor post 7 that is exposed through the upper surface 2a of the package main body 2. The conductor post 7 is thereby connected thermally and electrically to the electrically conductive plate 41. A remainder of the configuration of the semiconductor package 1 is similar or identical to that of Embodiment 1.

When the semiconductor packages 1 are used in a module, the electrically conductive plates 41 of the semiconductor packages 1 contact a cover main body portion 131 (FIG. 4). The conductor posts 7 are thereby connected thermally and electrically to a cover 13 by means of the electrically conductive plates 41. A coefficient of linear expansion of the electrically conductive plate 41 has a value that is closer to a coefficient of linear expansion of the cover 13 than a coefficient of linear expansion of the molded member 9, or is equal in value to the coefficient of linear expansion of the cover 13. A remainder of the configuration of the module is similar or identical to that of Embodiment 1.

In semiconductor packages 1 and a module of this kind, because the electrically conductive plate 41 is stacked on the upper surface 2a of the package main body 2, heat from the conductor post 7 can be radiated to the electrically conductive plate 41, further enabling improvements in exhaust heat performance of the semiconductor packages 1. In the module, because the electrically conductive plates 41 of the semiconductor packages 1 can be placed in contact with the cover 13, the coefficient of linear expansion at portions of the semiconductor packages 1 that contact the cover 13 can be set closer to the coefficient of linear expansion of the cover 13. Manufacturing of the module can thereby be facilitated, enabling improvements in reliability of the module to be achieved.

Moreover, in the above example, the material that constitutes the electrically conductive plate 41 is a metal, but a plate in which a metal filler is mixed together with a resin may be used as the electrically conductive plate 41.

In the above example, the electrically conductive plate 41 is stacked on the upper surface 2a of the package main body 2 according to Embodiment 1, but the electrically conductive plate 41 may be stacked on the upper surface 2a of a package main body 2 according to Embodiment 3.

Moreover, in the module in the above example, an electrically conductive filler 19 may be interposed between the electrically conductive plate 41 and the cover main body portion 131. By doing so, the conductor posts 7 and the cover 13 can be connected electrically by means of the electrically conductive filler 19, enabling thermal conductivity and electrical conductivity between the conductor posts 7 and the cover 13 to be further increased.

Figure 23:
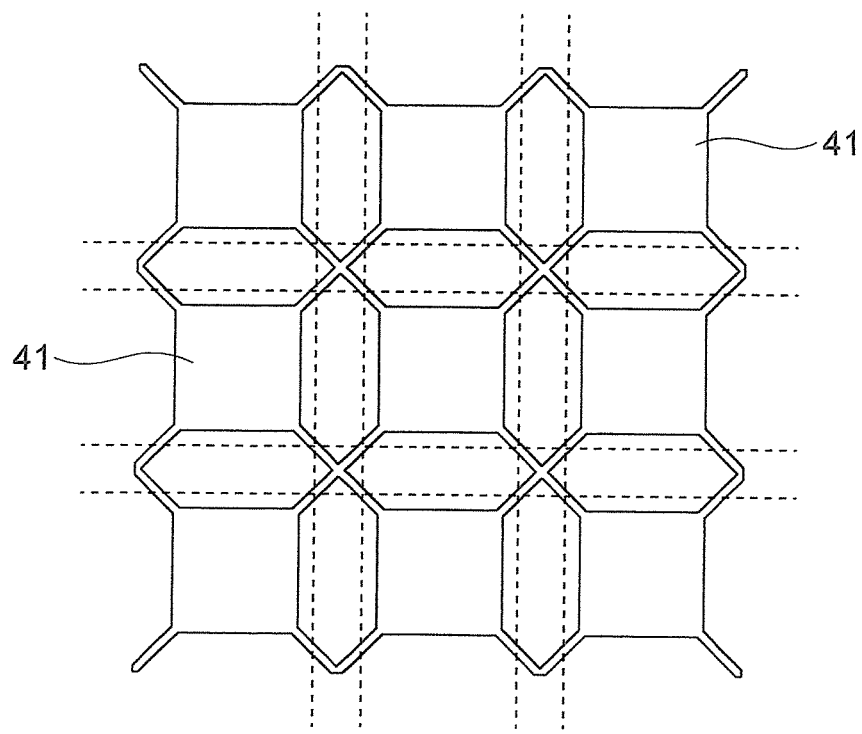
FIG. 23 is a front elevation that shows another example of an electrically conductive plate of the semiconductor package according to Embodiment 4 of the present invention.

In the above example, the shape of the electrically conductive plate 41 is rectangular, but is not limited thereto. For example, the shape of the electrically conductive plate 41 may be made similar or identical to the shape of the die pad 3. In that case, linked bodies in which a plurality of electrically conductive plates 41 are connected are formed by performing punching on a metal sheet, as shown in FIG. 23, and the electrically conductive plates 41 are manufactured by cutting the linked bodies of electrically conductive plates 41 at positions of broken lines in FIG. 23. Members that have identical shapes can thereby be used as both the die pads 3 and the electrically conductive plates 41, enabling sharing of manufacturing equipment to be achieved.

Figure 24:
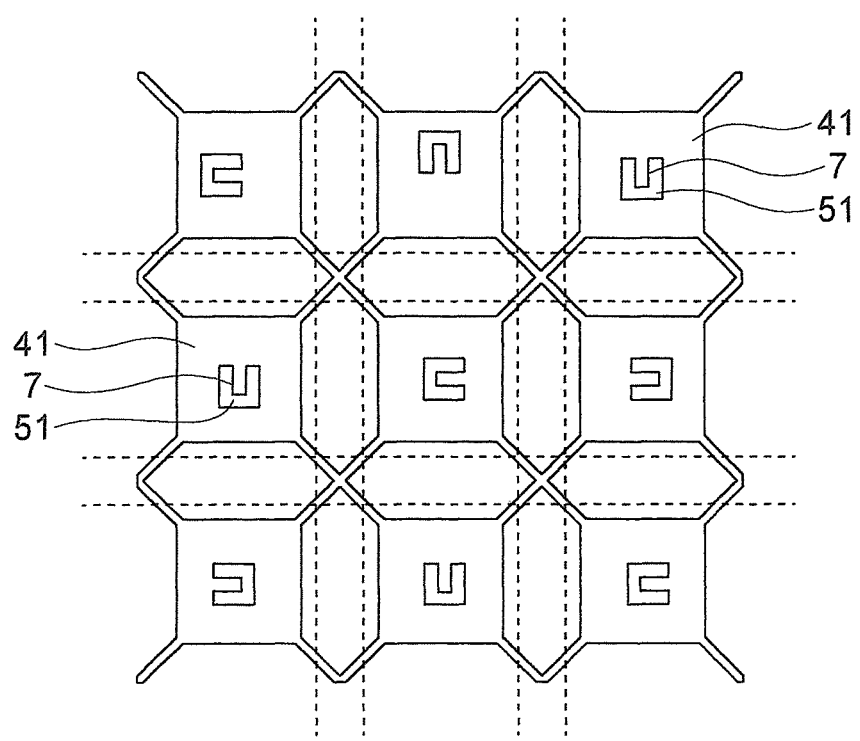
FIG. 24 is a front elevation that shows another example of an electrically conductive plate and a conductor post of the semiconductor package according to Embodiment 4 of the present invention.

In the above example, the conductor post 7 and the electrically conductive plate 41 are separate members, but the electrically conductive plate 41 and the conductor post 7 may formed by a shared metal sheet. In that case, the conductor post 7 is formed by inserting a U-shaped notch 51 in the electrically conductive plate 41, as shown in FIG. 24, and bending and standing a portion that is surrounded by the notch 51 relative to the electrically conductive plate 41. By doing so, the electrically conductive plate 41 and the conductor post 7 can be formed on a shared metal sheet, enabling thermal conductivity and electrical conductivity between the electrically conductive plate 41 and the conductor post 7 to be improved. Furthermore, the electrically conductive plate 41 and the conductor post 7 can be handled as a single body in the manufacturing steps of the semiconductor package 1, also enabling manufacturing operations for the semiconductor package 1 to be facilitated. Moreover, in FIG. 24, the notch 51 is inserted into an electrically conductive plate 41 that has an identical shape to the shape of the die pad 3, but it is not necessary for the shape of the electrically conductive plate 41 to be similar or identical to the shape of the die pad 3, and the shape of the electrically conductive plate 41 may be a rectangular shape that is similar or identical to the shape of the package main body 2, for example.

In each of the above embodiments, the number of conductor posts 7 that are disposed on the die pads 3 or metal inlays 35 is one, but is not limited thereto, and the number of conductor posts 7 that are disposed on the die pads 3 or metal inlays 35 may be two or more.

In each of the above embodiments, the material that constitutes the conductor post 7 is a metal, but is not limited thereto, and a member in which a metal filler is mixed together with a resin may be used as a conductor post 7, for example.

In the invention according to the present application, free combination of each of the above embodiments, and modification of any component in any of the above embodiments, or omission of any component in any of the above embodiments, are possible within the scope of the invention.

The invention claimed is:

1. A semiconductor package comprising a package main body and an electrically conductive thin film that covers the package main body, wherein:
    the package main body comprises:
        a lead frame that comprises first terminals and a die pad;
        two or more integrated circuit chips that are disposed on the die pad;
        one or more electrically conductive members that are disposed on the die pad;
        wires that connect the first terminals and the integrated circuit chips electrically; and
        a molded member that seals the lead frame, the integrated circuit chips, the electrically conductive member, and the wires;
    an upper surface, a bottom surface, and side surfaces of the package main body are formed by the molded member;
    the electrically conductive member is exposed through the upper surface of the package main body;
    the die pad is exposed through the bottom surface of the package main body;
    the lead frame further comprises second terminals that are different than the first terminals;
    the second terminals are exposed through the side surfaces of the package main body; and
    the electrically conductive thin film is electrically connected to both the electrically conductive member and the second terminals in a state in which the electrically conductive thin film covers the upper surface and the side surfaces of the package main body.

2. A module comprising:
    a semiconductor package comprising a package main body;
    a module circuit board on which a ground conductor is disposed, and to which the semiconductor package is mounted; and
    an electrically conductive cover that covers the semiconductor package,
    wherein:
    the package main body comprises:
        a lead frame that comprises first terminals and a die pad;
        two or more integrated circuit chips that are disposed on the die pad;
        one or more electrically conductive members that are disposed on the die pad;

wires that connect the first terminals and the integrated circuit chips electrically; and a molded member that seals the lead frame, the integrated circuit chips, the electrically conductive member, and the wires;

an upper surface, a bottom surface, and side surfaces of the package main body are formed by the molded member;

the electrically conductive member is exposed through the upper surface of the package main body;

the first terminals and the die pad are exposed through the bottom surface of the package main body;

the ground conductor and the cover constitute a shielding case that accommodates the semiconductor package in a state in which the ground conductor and the cover are connected to each other; and the electrically conductive member which is disposed inside the shielding case is electrically connected to both the ground conductor and the cover.

3. The module according to claim 2, wherein:

the semiconductor package further comprises an electrically conductive thin film that covers the package main body;

the lead frame further comprises second terminals that are different than the first terminals;

the second terminals are exposed through the side surfaces of the package main body; and the electrically conductive thin film is electrically connected to both the electrically conductive member and the second terminals in a state in which the electrically conductive thin film covers the upper surface and the side surfaces of the package main body.

4. The module according to claim 2, further comprising an electrically conductive plate that is stacked on the upper surface of the package main body, wherein:

the electrically conductive plate contacts a portion of the electrically conductive member that is exposed through the upper surface of the package main body; and a shape of the electrically conductive plate is similar or identical to a shape of the die pad.

5. A module comprising:

a semiconductor package comprising a package main body;

a module circuit board on which a ground conductor is disposed, and to which the semiconductor package is mounted; and an electrically conductive cover that covers the semiconductor package, wherein:

the package main body comprises:

a package circuit board on which a first terminal pattern and a second terminal pattern are disposed;

a metal inlay that is disposed on the package circuit board;

two or more integrated circuit chips that are disposed on the metal inlay;

one or more electrically conductive members that are disposed on the metal inlay;

vias that electrically connect the first terminal pattern and the second terminal pattern;

wires that connect the first terminal pattern and the integrated circuit chips electrically; and a molded member that seals the integrated circuit chips, the electrically conductive member, and the wires;

an upper surface and side surfaces of the package main body are formed by the molded member;

a bottom surface of the package main body is formed by the package circuit board;

the electrically conductive member is exposed through the upper surface of the package main body;

the second terminals and the metal inlay are exposed through the bottom surface of the package main body;

the ground conductor and the cover constitute a shielding case that accommodates the semiconductor package in a state in which the ground conductor and the cover are connected to each other; and the electrically conductive member which is disposed inside the shielding case is electrically connected to both the ground conductor and the cover.

6. The module according to claim 2, wherein:

the semiconductor package comprises an electrically conductive plate that is stacked on the upper surface of the package main body; and the electrically conductive plate contacts a portion of the electrically conductive member that is exposed through the upper surface of the package main body.

7. The module according to claim 2, wherein:

an electrically conductive filler is interposed between the semiconductor package and the cover; and the electrically conductive member and the cover are electrically connected by means of the electrically conductive filler.

8. The module according to claim 5, wherein:

the semiconductor package comprises an electrically conductive plate that is stacked on the upper surface of the package main body; and the electrically conductive plate contacts a portion of the electrically conductive member that is exposed through the upper surface of the package main body.

9. The module according to claim 3, wherein:

an electrically conductive filler is interposed between the semiconductor package and the cover; and the electrically conductive member and the cover are electrically connected by means of the electrically conductive filler.

10. The module according to claim 4, wherein:

an electrically conductive filler is interposed between the semiconductor package and the cover; and the electrically conductive member and the cover are electrically connected by means of the electrically conductive filler.

11. The module according to claim 5, wherein:

an electrically conductive filler is interposed between the semiconductor package and the cover; and the electrically conductive member and the cover are electrically connected by means of the electrically conductive filler.

12. The module according to claim 6, wherein:

an electrically conductive filler is interposed between the semiconductor package and the cover; and the electrically conductive member and the cover are electrically connected by means of the electrically conductive filler.

* * * * *